Figure 1:
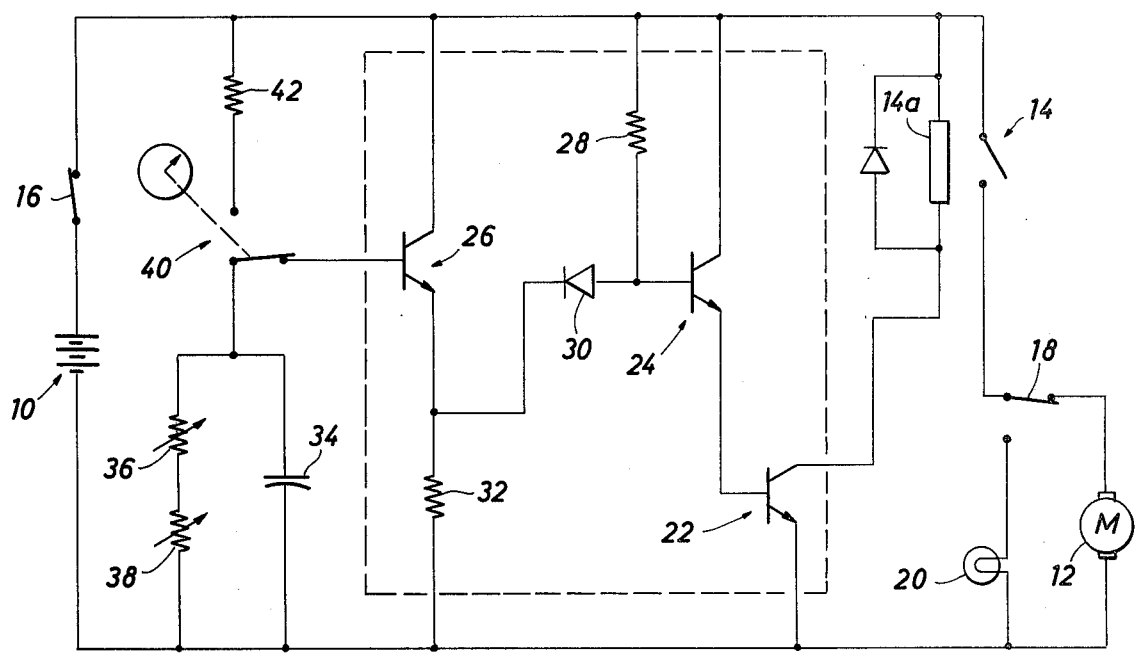

United States Patent [19]
Calusio

[11] 4,200,826
[45] Apr. 29, 1980

[54] TIMING CIRCUIT FOR GAME FEEDER

[75] Inventor: Joseph C. Calusio, Kingsville, Tex.

[73] Assignee: Lehman H. Feeder & Plow, Inc., Corpus Christie, Tex.

[21] Appl. No.: 23,742

[22] Filed: Mar. 26, 1979

[51] Int. Cl.$^2$ ............. H01H 7/00; H01H 43/00
[52] U.S. Cl. ............. 318/484; 119/51.11; 307/141.4
[58] Field of Search ......... 318/484; 361/196; 307/141, 141.4; 119/51.11

[56] References Cited
U.S. PATENT DOCUMENTS

| | | | |
|---|---|---|---|
| 3,165,648 | 1/1965 | Sainsbury | 361/196 |
| 3,423,600 | 1/1969 | Pringle | 307/141.4 |
| 3,458,772 | 7/1969 | Egart et al. | 307/141.4 |
| 3,993,569 | 11/1976 | Zinsmeyer et al. | 361/176 |

*Primary Examiner*—David Smith, Jr.

[57] ABSTRACT

In a timing circuit for controlling the time of operation of the electric motor of a game feeder, first and second semiconductor switching devices are connected so that the control electrode of the first is connected to a power source but will not conduct until the second semiconductor switching device is conductive. The first switching device when conducting actuates motor control means to run the motor. The second switching device is in its conductive state for a period of time controlled by an RC timing circuit.

9 Claims, 3 Drawing Figures

TIMING CIRCUIT FOR GAME FEEDER

This invention relates to game and stock feeders generally and in particular to a transistorized RC circuit for supplying power to the electric motor of a feeder for timed periods ranging from a few seconds up to about 60 seconds.

Game feeders, such as the type described in U.S. Pat. No. 3,195,508, entitled "Game and Stock Feeder", which issued on July 29, 1965 to Lehman et al, employ timing circuits. A clock is used to control the time each day that the feeder is operated. Usually, the feeder is turned on to spread feed twice a day, once in the morning and once in the late afternoon. The clock turns the device on or starts its operation and the length of time it operates is controlled by an RC circuit. A relay is employed to connect the battery to the motor. The capacitor and the resistor of the RC circuit is connected in parallel with the coil of the relay so that the voltage across the charged capacitor is impressed in the coil to actuate the relay and connect the motor to the battery. The relay remains closed and the motor runs for the length of time required to discharge the capacitor to the point where the voltage across the coil cannot hold the relay closed.

One of the problems with this arrangement is the constantly declining voltage across the coil of the relay, which results in a continuous decrease in the ability of the relay to hold its contacts closed. Complicating this problem is the vibration produced in the feeder as it operates. The vibration causes the contacts of the relay to bounce apart with increasing frequency as the voltage across the coil of the relay decreases.

It is an object of this invention to provide a game feeder having a timing circuit to control the flow of current to the motor of the feeder that is not affected by the vibration imposed on the feeder by its operation.

It is another object of this invention to provide a game feeder having a timing circuit wherein the declining charge on the capacitor of the RC circuit, during the timed interval, does not affect the ability of the switch connecting the battery to the motor to remain closed at all times during the timed interval.

Since game feeders are located mostly in remote areas, they are usually battery operated. Over a period of time voltage of the battery decreases. Once the resistance in the RC circuit is set to produce a given time of operation, as the battery voltage decreases, the timed interval decreases also. The resistance can be changed from time to time to adjust the circuit for the decreasing battery voltage, but this requires, one or more tips to the feeder.

Therefore, it is another object and feature of this invention to provide a battery operated feeder housing a timing circuit that will operate the feeder for preselected constant periods of time during a period of time even though the voltage of the battery is decreasing during the period.

These and other objects, advantages and features of this invention will be apparent to those skilled in the art from a consideration of this specification, including the attached drawings and appended claims.

Figure 2:
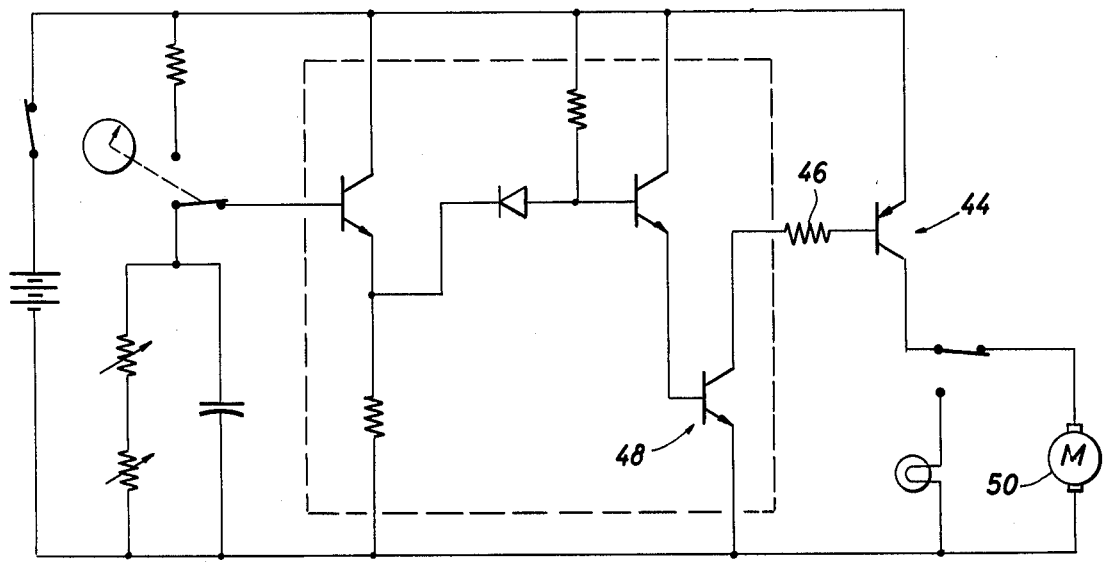
Figure 3:
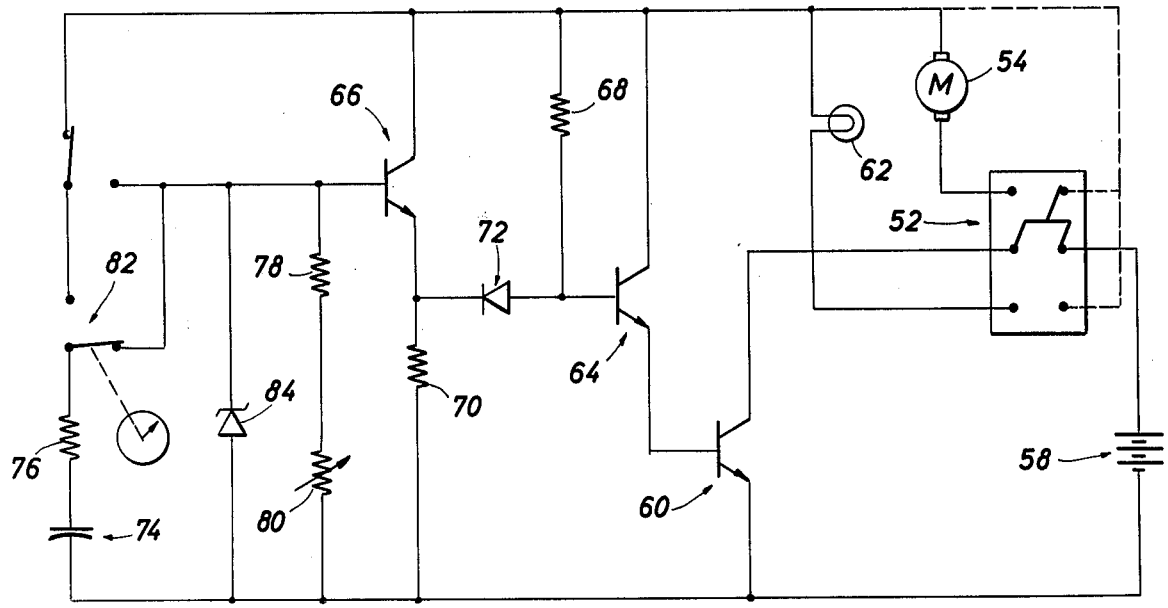

In the drawings;

FIGS. 1, 2, and 3 are circuit diagrams of three different embodiments of game feeder timing circuits employing this invention.

In FIG. 1, battery 10 is connected to motor 12 through relay 14. Manual switches 16 and 18 are also in this circuit. Switch 16 is simply an on-off switch for the feeder. Switch 18 is used to divert the flow of current from motor 12 to lamp 20, so that the timing circuit can be adjusted to operate motor 12 for the desired length of time without actually operating the motor.

In accordance with this invention, the game feeder timing circuit includes motor control means for connecting the motor to the power supply, in this embodiment battery 10, when the motor control means is in a conductive condition. In the embodiment shown in FIG. 1, the motor control means includes relay 14 and transistor 22. The transistor is connected with its collector and emitter in series with coil 14a of the relay. Thus, when transistor 22 is in its conductive state, it will allow current to flow through coil 14a, close the contacts of the relay, and connect motor 12 to battery 10. The state of transistor 22 is determined by the current flowing to its base.

To control the operation of the motor control means the timing circuit includes first semiconductor switching device or transistor 24 and second semiconductor switching device or transistor 26. Each of the transistors have input, output, and control electrodes. In the embodiment shown, the control electrode is the base of the transistors. Transistor 24 is connected with its input electrode or collector connected to the power supply means, battery 10. Its output electrode or emitter is connected to the control electrode i.e. the base of transistor 22. Thus, when first transistor 24 is in its conductive state, transistor 22 will be biased forwardly into its conductive state and relay 14 will connect the motor to the battery. In accordance with the timing circuit of this invention, first transistor 24 will be biased into its conductive state only so long as second transistor 26 is also in its conductive state and this is controlled by the RC portion of the circuit as will be explained below.

The base or control electrode of transistor 24 is connected to the battery through resistor 28. The base is also connected to the output of transistor 26 through diode 30, which is arranged to allow current to flow to the output side of transistor 26, but not in the other direction. Transistor 26 has its collector or input electrode connected to the battery and its output electrode or emitter connected to resistor 32 and the other side of the battery. With this arrangement, current will flow through resistor 28 to the base of transistor 24 at all times. This current can also flow through diode 30 and resistor 32. To prevent the current flowing through resistor 28 from firing transistor 24, the resistance of resistor 28 is very high relative to the resistance of resistor 32. Thus there will be a constant trickle of current through resistor 28, but it is quickly bled off through diode 30 and resistor 32 so that the current at the base of transistor 24 will not be sufficient under these conditions to bias this transistor into its conductive state. When transistor 26 becomes conductive however, current will flow through transistor 26 and resistor 32. This current will block the flow of current through diode 30 and allow the current flowing through resistor 28 to fire transistor 24. This, in turn, will actuate the motor control means and start the motor to run.

As explained above, an RC timing circuit is employed to control the state of transistor 26 and thus control the motor control means. The RC circuit consists of capacitor 34, which is connected in parallel with varible resistors 36 and 38, which are connected in series. The RC circuit is connected to the common terminal of switch 40. Switch 40 is clock operated and is arranged, as for example in the matter described in the above identified patent, to connect the RC circuit to battery 10 through resistor 42 at selected times of the day. This may be once a day, twice a day or more as desired as explained in the patent. The switch is held in position to connect the RC circuit to the battery long enough for capacitor 34 to be substantially charged to the output voltage of the battery. Resistor 42 prevents the closing of switch 40 from producing a full flow of current to the capacitor which shortens the life of the battery. Resistor 42 allows the charge to build up over a period of time.

After the switch has been in position to charge the capacitor for a sufficient length of time, it is released and allowed to return to the normal position shown in FIG. 1. This connects the RC circuit to the base of transistor 26. Capacitor 34 will begin to discharge at this point through resistors 36 and 38 and bias transistor 26 forwardly into its conductive state. As explained above, this will cause the motor control means to be moved to its conductive state and the motor supplied with power from the battery. The length of time required to discharge capacitor 34 to the point where transistor 26 turns off is determined by the adjustment of variable resistors 36 and 38.

The timing circuit of FIG. 2 is the same as the circuit of FIG. 1 with the exception that relay 14 of FIG. 1 is replaced by power transistor 44. In this embodiment, transistor 44 is arranged with its base or control electrode connected through resistor 46 to the input electrode or collector of transistor 48. Power transistor 44 is biased forwardly to its conductive state when transistor 48 is biased into its conductive state in the manner described above in connection with FIG. 1, thereby providing power to motor 50.

In the embodiment shown in FIG. 3, the motor control means includes double pole double throw switch 52, which in one position connects motor 54 to battery 58 through the collector-input and emitter-output of power transistor 60. Thus, with this arrangement when power transistor 60 is biased forwardly to its conductive state, it will connect motor 54 to the power source, which is battery 58. When the double pole double throw switch is moved to its other position, it connects lamp 62 in the same circuit to allow the timing sequence to be adjusted, as explained above.

The remainder of the circuit of FIG. 3 includes a first transistor 64 and second transistor 65, which are connected in the circuit in the same manner as described above in connection with FIG. 1. The RC portion of the circuit comprises a capacitor 74 and series resistor 76, which are connected parallel with fixed resistor 78 and variable resistor 80. This RC circuit is also connected to the base of second transistor 66. Clock actuated switch 82 operates in the same manner as described above to periodically connect fixed resistor 76 and capacitor 74 to the battery to charge the capacitor and then to return switch 82 to its normal position connecting the RC circuit to the base of second switching transistor 66.

As explained above game feeders are usually placed in remote locations and are unattended for relatively long periods of time. Since these devices are battery operated, as the days go by the battery voltage declines. This results in a continual reduction in the length of time of the operation of the feeder due to the continuing drop in the charge applied to the capacitor 74 for a given setting of variable resistor 80. Therefore, in accordance with another feature of this invention, means are provided to limit the charge on a capacitor 74 to a value less than the potential of the battery when fully charged so that during the period of time required for the voltage of the battery to decline to the limit provided by the voltage limiting means, the time of operation of the device will remain substantially constant.

In the embodiment shown in FIG. 3, zener diode 84 is connected in parallel with capacitor 74 and with resistors 78 and 80. The diode is chosen to drop the charge on capacitor 74 immediately to some lower voltage, when the RC circuit is switched to the base of second switching transistor 66. By dropping the voltage to this constant voltage each time the device is operated, as long as the battery has the ability to charge the capacitor to a value above that of the zener diode, the RC circuit will time out in approximately the same length of time for each operation. For example, if battery 58 is a twelve volt battery and zener diode 84 is chosen to drop the voltage on capacitor 74 to a value of seven volts, then as long as the battery is able to charge capacitor 74 to seven volts, or above the length of time for the RC circuit to time out will remain substantially constant.

From the foregoing it will be seen that this invention is one well adapted to attain all of the ends and objects hereinabove set forth, together with other advantages which are obvious and which are inherent to the apparatus.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the accompanying drawings is to be interpreted as illustrative and not in a limiting sense.

The invention having been described, what is claimed is:

1. In a feeder for distributing feed at a preselected time or times during the day having an electric motor for operating the feeder, power supply means for providing electrical energy to operate the motor, and clock means for actuating a timing circuit for operating the electric motor for a limited period of time, including the improvement comprising motor control means for connecting the motor to the power supply means when the motor control means is in a conductive condition; first and second semiconductor switching devices connected to said motor control means and controlling the same to a conductive condition to energize the motor when the semiconductor switching devices are in a conductive condition; said semiconductor devices having input, output, and control electrodes, with the input electrodes of both devices connected to power supply means, the output of the first connected to the motor control means, the control electrode of the first connected to the power supply means through a resistance and to the output of the second semiconductor switching device and ground through a diode arranged to prevent current flow from the output of the second device to the control electrode of the first while allowing current leakage through the resistor to ground to prevent the current flowing through the resistor to the control electrode of the first device from biasing the first device to a conductive condition until the second semiconductor device is biased to a conductive condition to stop the flow of leakage current through the diode and cause the current to the control electrode of the first device to bias it to a conductive condition thereby actuating the motor control means, and timing means connected to the control electrode of the second semiconductor switching device to bias the second semiconductor device to a conductive condition for a predetermined period of time.

2. The feeder of claim 1 in which the timing means includes an RC circuit having a capacitor and a resistor connected in parallel to ground, a clock operated switch for connecting the RC circuit to the power supply means at preselected times during a time period to charge the capacitor and switching the RC circuit from the power supply means to the control electrode of the second semiconductor switching device to bias the device and the first switching device to a conductive state for the period of time required to discharge the capacitor through the parallel resistor to ground.

3. The feeder of claim 2 in which the resistor of the RC circuit is variable to allow the time required to discharge the capacitor to be adjusted.

4. The feeder of claim 3 in which the power supply means is a battery and in which the RC circuit includes a zener diode connected in parallel to limit the voltage impressed on the capacitor to less than the voltage of the battery when fully charged to maintain the charge on the capacitor constant and the time the motor is operated constant until the voltage output of the battery drops below the break down voltage of the zener diode.

5. The feeder of claim 1 in which the motor control means comprises a relay having its coil connected to the power supply means and a third semiconductor switching device having it input connected to the coil of the relay, its output to ground, and its control electrode connected to the output of the first switching device to bias the third semiconductor device to a conductive state when the first and second devices are conducting to actuate the relay and operate the motor during the time period.

6. The feeder of claim 1 in which the motor control means includes third and fourth semiconductor devices, said third device having its input electrode connected to the control electrode of the fourth device to bias the fourth to a conductive state when the third is conductive, the output of the third device is connected to ground and its control electrode is connected to the output electrode of the first device to bias the third to a conductive state when the timing means biases the first and second switching devices to a conductive state, said fourth device having its input electrode connected to the power supply means and its output connected to the motor to supply power to the motor when the fourth semiconductor device is conductive.

7. The feeder of claim 1 in which the motor control means includes a third semiconductor device having its input and output connected in series with the power supply means and the motor and its control electrode connected to the output electrode of the first semiconductor switching device to bias the third to a conductive state and operate the motor while the timing means is biasing the first and second semiconductor switching devices to a conductive state.

8. A feeder for distributing feed at a preselected time or times during the day comprising an electric motor for operating the feeder, clock means for actuating the feeder at selected times, a timing circuit for periodically operating the electric motor for a preselected period of time, power supply means for providing electrical energy to operate the motor, motor control means for connecting the motor to the power supply means when the motor control means is in a conductive condition; first and second semiconductor switching devices connected to said motor control means and controlling the same to a conductive condition to energize the drive motor when the semiconductor switching devices are in a conductive condition; said semiconductor devices having input, output, and control electrodes, connected with the input electrodes of both connected to power supply means, the output of the first device connected to the motor control means, the control electrode of the first device connected to the power supply means through a resistance and to the output of the second semiconductor switching device and ground through a diode arranged to prevent current flow from the output of the second device to the control electrode of the first and to allow current leakage through the resistor to ground to prevent the current flowing through the resistor to the control electrode of the first from biasing the first to a conductive condition until the second semiconductor device is biased to a conductive condition to stop the flow of leakage current through the diode and cause the current to the control electrode of the first to bias it to a conductive condition thereby actuating the motor control means, and timing means connected to the control electrode of the second semiconductor switching device to bias the second semiconductor device to a conductive condition for a predetermined period of time, the timing means including an RC circuit having a capacitor and a resistor connected in parallel to ground, a switch actuating the clock means for connecting the RC circuit to the power supply means at preselected times during a time period to charge the capacitor and for switching the RC circuit from the power supply means to the control electrode of the second semiconductor switching device to bias the device and the first switching device to a conductive state for the period of time required to discharge the capacitor through the parallel resistor.

9. The timer of claim 8 in which the power supply means is a battery and in which the RC circuit includes a zener diode connected in parallel to limit the voltage impressed on the capacitor to less than the voltage of the battery when fully charged to maintain the charge on the capacitor constant and the time the motor is operated constant until the voltage output of the battery drops below the break down voltage of the zener diode.

* * * * *